United States Patent [19]

Suzawa

[11] Patent Number: 4,965,246

[45] Date of Patent: Oct. 23, 1990

[54] CURRENT-CARRYING LEAD FORMED OF A CERAMIC SUPERCONDUCTIVE MATERIAL CARRIED BY A SUPPORT

[75] Inventor: Chizuru Suzawa, Osaka, Japan

[73] Assignee: Sumitomo Electric Industries, Ltd., Osaka, Japan

[21] Appl. No.: 174,468

[22] Filed: Mar. 28, 1988

[30] Foreign Application Priority Data

Mar. 31, 1987 [JP] Japan .................................. 62-80401
Mar. 31, 1987 [JP] Japan .................................. 62-80408

[51] Int. Cl.$^5$ ......................... H01B 12/00; H01F 5/08
[52] U.S. Cl. ...................................... 505/1; 174/15.4; 439/843; 505/885
[58] Field of Search ................. 174/15.3, 15.4, 15.5, 174/125.1; 335/216; 439/485, 843; 505/1, 884, 885, 887, 700, 701, 704, 705, 730, 731, 732, 739, 740, 741

[56] References Cited

U.S. PATENT DOCUMENTS 4,585,696 4/1986 Dustmann et al. .......... 174/125.1 X
4,826,808 5/1989 Yurek et al. ..................... 505/1

FOREIGN PATENT DOCUMENTS 59-98505 6/1984 Japan ................................... 335/216

OTHER PUBLICATIONS

Koinuma, H., et al., "Preparation of $(La_{1-x}Sr_x)_2CuO_{4-\delta}$ Superconducting Films by Screen Printing Method", Department of Industrial Chemistry, University of Tokyo, pp. L399-L401, Mar. 23, 1987, Document No. 00270.

Larbalestier, D. C., et al., "Microstructural and Electromagnetic Characterization of $La_{2-x}Sr_xCuO_4$", Mar. 18, 1987, 5 pages, Document 00144.

Kohno, O., et al, "Critical Temperature and Critical Current Density of La-Sr-Cu Oxide Wires", *Japanese Journal of Applied Physics*, vol. 26, No. 5, May 1987, pp. L759-L760, Doc. 00461.

Jin, S., et al., "Fabrication of 91K Superconducting Coils", Proceedings of Symposium S 1987, Spring Meeting of the Materials Research Society, Apr. 23-24 1987, pp. 219-221.

*Primary Examiner*—Laramie E. Askin
*Attorney, Agent, or Firm*—Sughrue, Mion, Zinn, Macpeak & Seas

[57] ABSTRACT

A current-carrying lead that may be connected between a source of current and a superconducting device and which comprises a ceramic superconductor and a support made of an insulator, a nonmagnetic metal or a good electrical conductor. The lead may be contructed to conduct currents having a single or dual polarities.

12 Claims, 2 Drawing Sheets

CURRENT-CARRYING LEAD FORMED OF A CERAMIC SUPERCONDUCTIVE MATERIAL CARRIED BY A SUPPORT

BACKGROUND OF THE INVENTION

The present invention relates to a current-carrying lead for supplying an electric current to superconducting magnets and like devices.

An electric current is supplied to superconducting magnets and other superconducting devices by means of current-carrying leads provided between the source of current supply and the device. Conventionally, such current-carrying leads are made of copper conductors in rod or pipe form. However, copper has both electrical conducting (non-superconducting) and thermal conducting properties. Because of these properties, the heat generated by the copper conductor when a current is applied and the heat transmitted from the terminal on the hot side are conducted to liquid helium, liquid nitrogen or other cryogenic media (cryogens) in which the superconducting magnet is submerged, thereby causing such cryogens to evaporate.

To minimize the heat conduction to liquid helium, several methods have been proposed for use with prior art current-carrying leads and one common approach is depicted in FIG. 1. There, spiral cooling fins 110 are provided on the surface of the lead which is accommodated in a stainless steel sheath 120. Notwithstanding this cooling structure, the helium gas 130 is evaporated by the heat of conduction drawn into the lead 100 from a terminal 140 connected to the superconducting magnet and the heat generated by the electrical current supplied to the magnet through the cooled lead and a terminal 150. In an attempt to further reduce the conduction of heat to the liquid helium, further testing and research is underway, with emphasis being placed on the effort to improve the construction of current-carrying leads. However, it has been generally believed that a heat conduction of 1 watt per 1,000 amps of applied current is unavoidable in the state of the art.

Current-carrying leads for use with superconducting magnets and like devices are also available in "detachable" form consisting of a socket. A plug and a prior art product of this type is illustrated in FIG. 2. A plug 21 made of copper is coupled to a terminal on the hot side 24 to a power source (not shown) via a normal conducting current-carrying lead 23 made of copper in rod, pipe or busbar form. A socket 22 is provided at a terminal on the cold side 26 to a superconducting magnet or like device (not shown). The plug 21 is inserted into the socket 22 for conducting current or is detached from the socket to cut off the current supply. The socket 22 is made of brass or copper and is furnished in its interior with one or more beryllium-copper, multi-face contactors 25, depending upon the current-carrying capability of the lead. The spring properties of the contactors are utilized to minimize the contact resistance between the plug 21 and socket 22.

The socket and plug in the above-described detachable current-carrying lead are made of copper conductors or brass (in the case of the socket) which are both good electrical conductors and good heat conductors as well. Accordingly, a Joule loss will occur as a result of a voltage drop that takes place in the material itself when current is applied and which also takes place due to the contact resistance between the socket and plug. The heat generated by this Joule loss is transmitted into the liquid helium, liquid nitrogen or other cryogenic media in which the superconducting magnet is submerged, and the heated cryogens will evaporate.

In order to ensure maximum current-carrying capability of the lead, the normal conducting metal must have a sufficient cross-sectional area. However, a greater area will result in increased heat condition from the hot area to the cryogenic medium. Research has been focused on methods to minimize this heat conduction to the cryogenic media. It has been found to date that a voltage drop of about 13 mV per 1,800 A of applied current is unavoidable between plug and socket. If a pair of leads having opposite polarities are used, the overall heat conduction is about 1.800 A×0.013 V×2=46.8 W. Liquid helium used as a cryogen will evaporate in an amount of 1.4 L/h per heat conduction of 1 W and as much as 65.52 L/h of liquid helium will volatilize under heat conduction of 46.8 W.

SUMMARY OF THE INVENTION

The present invention is intended to solve the aforementioned problems of the prior art current-carrying leads. An object, therefore, of the present invention is to provide a current-carrying lead to a superconducting device that is capable of suppressing the evaporation of liquid helium, liquid nitrogen or other cryogen in the superconducting device due to heat conduction.

This object of the present invention can be attained by a current-carrying lead, disposed between a source of current supply and a superconducting device, which is in the form of a composite consisting of a ceramic superconductor and a support made of an insulator, a nonmagnetic metal or a good electrical conductor.

The current-carrying lead of the present invention is formed of a composite that consists of a ceramic superconductor and a support made of an insulator, a nonmagnetic metal of a good electrical conductor, so it is substantially free from heat generation when current is applied at a temperature below the critical temperature (i.e., the superconducting transition temperature). Under those conditions, heat conduction from a hot area to a cryogen, such as liquid helium or liquid nitrogen in a superconduction device, can be sufficiently reduced to suppress its evaporation.

PREFERRED EMBODIMENTS OF THE INVENTION

Representative embodiments of the present invention are described hereinafter with reference to the accompanying drawings.

Figure 1:
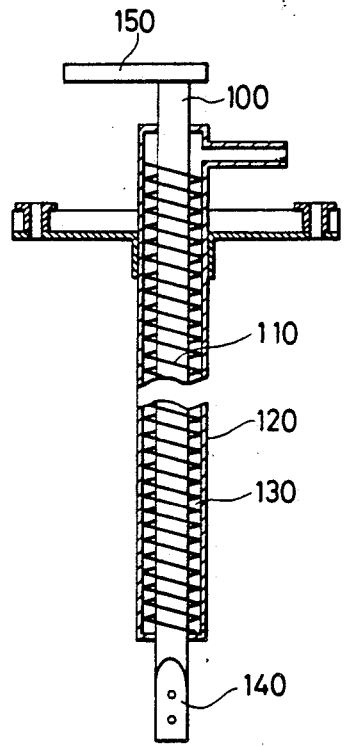
FIGS. 1 and 2 are longitudinal sections of two prior art current-carrying leads.
Figure 2:
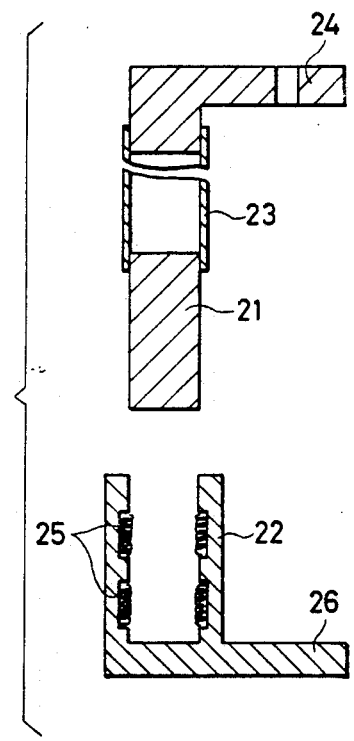
Figure 3:
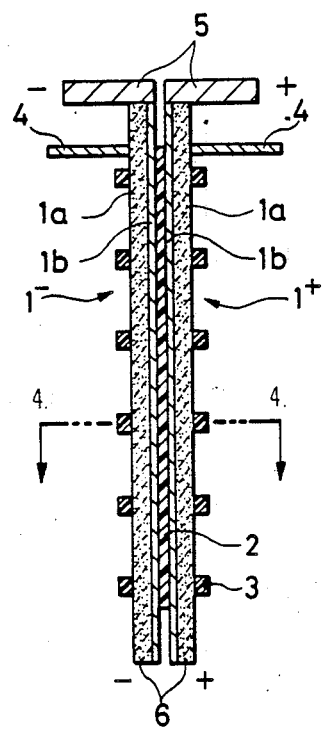
FIG. 3 is a longitudinal section of a current-carrying lead accord in a first embodiment of the present invention.
Figure 4:
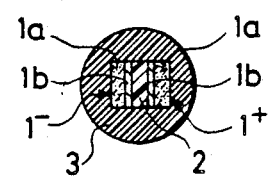
FIG. 4 is a cross section of FIG. 3 taken on line 4—4.

FIG. 3 is a longitudinal section of a pair of current-carrying leads 1, opposite in polarity, that are fabricated according to one embodiment of the present invention. FIG. 4 is a cross section of FIG. 3 taken on line 4—4.

Each of the current-carrying leads 1 is in the form of a composite that consists of a superconductor 1a made of a ceramic oxide and a support 1b for the superconductor 1a that is made of an insulator such as FRF (fiber-reinforced plastic) or a nonmagnetic metal such as copper, aluminum or stainless steel. In a preferred embodiment, the support 1b is made of a nonmagnetic metal since it will serve not only as a support for the superconductor 1a but also as a stabilizer of the same.

A ceramic superconductor is disclosed for example, in (1) Zeitschrift fur Physik B vol. 64, 1986, pages 189-193, J. G. Bednorz et al (La-Ba-Cu-0); (2) Japanese Journal of Applied Physics vol. 26, No. 1, January, 1987, pages L1-L2, S. Uchida et al, (La-Ba-Cu-O); and (3) Physical Review Letters, vol. 58, No. 9, March, 1987, pages 908-910, M. K. Wu et al (Y-Ba-Cu-O).

In order to fabricate the current-carrying lead 1, a powder of the superconductor 1a is placed on the support 1b made of a nonmagnetic metal and thereafter compacted, bonded, extruded, electrodeposited or otherwise processed to make a unitary assembly of the two members. Alternatively, the superconductor 1a is first formed into an appropriate shape and subsequently bonded or mechanically bound to the support 1b so a to make a unitary, composite structure. If the two members are to be made into a unitary form by bonding, an organic material such as an epoxy resin may be used as an adhesive agent and this method is preferred for commercial applications.

The current-carrying lead 1 may be used independently but in a preferred embodiment, two leads of opposite polarities are combined to make a pair (as in FIG. 3). This combined structure offers the advantage of compactness, when compared to the case where individual leads are used separately.

The first embodiment of the present invention in which a pair of current-carrying leads 1+, 1— are employed is described below in greater detail. A spacer 2 that extends longitudinally is provided between the two leads 1+, 1— and the assembly is supported by means of retainers 3 that are provided around the assembly and spaced along its axis.

If the support 1b is made of a metal, the spacer 2 is made of an insulator such as GFRP (glass-fiber reinforced plastic) or CFRP (carbon-fiber reinforced plastic). If the support 1b is made of an insulator, the spacer 2 may be made of an insulator or a metal, or may be omitted entirely. The retainers 3 may be insulating disks that are fitted onto the assembly of current-carrying leads and spacer, or may be a binding-insulating tape that is wrapped around the assembly.

If a current is passed through the pair of leads 1+, 1—and a magnetic field is applied to the circumference of the leads, the Lorentz force acting between one lead and the external field will push the Lorentz force acting between the other lead and the applied field in such a way that the two leads are pressed against each other. Therefore, the spacer 2 must be strong enough to withstand the compressive force acting between the two leads 1+, 1—. At the same time, the spacer must offer a satisfactory insulating distance between the two leads. On the other hand, the retainers 3 need not be as rugged as the spacer 2 and may be omitted or of a very small size. Because of this compactness, the embodiment shown in FIG. 3 is advantageous for practical applications.

If a current is passed through the pair of leads when they are not magnetized, the leads will themselves generate a magnetic field. Since the current flows through the two leads in opposite directions, a Lorentz force will be exerted in such a direction that the two leads repel each other. Therefore, unlike the case where current is passed through the pair of leads with a magnetic field being applied to the circumference of the leads, the retainers 3 must be made more rugged than the spacer 2 when current is to be passed in the absence of any applied field. In FIG. 3, a flange 4 may be seen with which the leads 1+, 1— are mounted on the top flange of a cryostat in such a way that the leads are electrically insulated from the cryostat. The assembly shown in FIG. 3 also includes terminals 5+, 5— that may be connected to the hot side and terminals 6+, 6— that may be connected to the superconducting magnet (not shown).

The ceramic superconductor may be made by sintering materials known to be used for ceramic superconductors. Such materials may be available in elementary or compound forms that contain elements capable of producing superconductors. Illustrative elements having this property include group I elements, group II elements and group III elements of the periodic table, as well as oxygen and fluorine.

More specifically, preferred Group I elements of the periodic table include Ia elements such as Li, Na, K, Rb and Cs, and Group Ib elements such as Cu, Ag and Au. Preferred Group II elements of the periodic table include Group IIa elements such as Be, Mg, Ca, Sr, Ba and Ra, and Group IIb elements such as Zn and Cd. Preferred Group III elements of the periodic table include Group IIIb elements, such as Sc, Y, Lanthanides (e.g., La, Ce, Gd and Lu), actinides (e.g., Ac, Th, Pa and Cf), and Group IIIa elements such as Al, Ga, In and Tl. Preferred ceramic super-conductors are those which are composed of (i) an element selected from among Group Ib elements, (ii) an element selected from among Group IIa elements (notably in oxides), Group IIIb elements and lanthanides and (iii) an element selected from among oxygen and flourine. Preferred Group Ib elements are Cu and Ag.

When a current-carrying lead 1 was fabricated using an oxide ceramic superconductor 1a, the actual measurement of heat conduction from the hot area to a cryogen showed that the integral value of heat conduction for 4.2–300 K $$\left( \int_{4.2K}^{300K} \lambda dT; \right.$$

where $\lambda$ is heat conductivity) was approximately $1,990 \times 10^{-3}$ (W/cm). This value is approximate to those of glass and quartz and is about 1/800 of the value for electrolytic copper (1,620 W/cm) or 1/230 of that for phosphorus deoxidized copper (461 W/cm). It is therefore evident that the current-carrying lead of the present inVention is very effective in suppressing heat conduction to cryogenic media.

If the support 1b, which is to be combined with the superconductor 1a, is made of an insulator such as a poly-tetrafluoro-ethylene resin, GFRP or CFRP, the heat conduction is further decreased to a much smaller value in the range of $700 \times 10^{-3}$ to $1,000 \times 10^{-3}$ (W/cm). Even if the support 1b is made of metal, current will not be passed through the metal, unlike the case of the prior art products, and the support 1b will function as a stabilizer or support for the superconductor 1a. Therefore, the cross-sectional area of the support 1b need not be made as large as the area found in the prior art versions in order to ensure the necessary current-carrying capability of the lead. The size of support 1b must be sufficient to simply enable the support 1b to function both as a stabilizer and support for the superconductor 1a. Therefore, this also contributes to a pronounced reduction in heat conduction to liquid helium and other cryogens.

Figure 5:
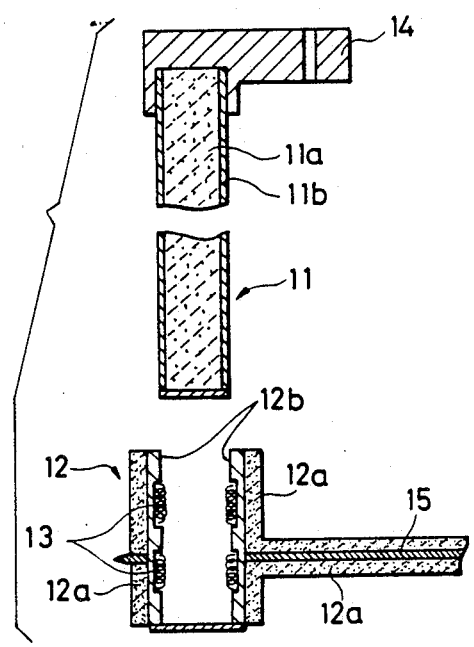
FIG. 5 is a longitudinal section of a current-carrying lead according to a second embodiment of tho present invention.

FIG. 5 is a longitudinal section of a current-carrying lead according to a second embodiment of the present invention. This is a detachable lead composed of a plug 11 and a socket 12. The plug 11 has a current terminal 14 at the normal temperature side. It is formed as a composite in which a superconductor 11a, made of an oxide ceramic, is packed in a support 11b, made of a good electrical conductor such as copper or aluminum in pipe form. After packing the superconductor 11a into the tubular support 11b, the plug 11 is swaged, optionally followed by an expanding or contracting treatment, to obtain a desired length and shape.

The socket 12 into which the plug 11 is to be inserted is also readily fabricated. The powder of a ceramic superconductor 12a is placed on the outer surface of a support 12b made of a good electrical conductor such as copper or aluminum in pipe form and thereafter is compacted, bonded, extruded, electrodeposited or otherwise processed to make a unitary assembly of the two members. The support 12b, made of a good electrical conductor in pipe form, is fitted in its interior with an appropriate number of multi-face contactors 13 made of beryllium-copper, depending upon the current-carrying capability of the lead. In FIG. 5, two of such contactors are provided. The spring properties of the contactors are utilized to minimize the contact resistance between the plug and socket.

The support 12b is made of a good electrical conductor and is connected to a terminal 15 at the cold side and forms an integral part thereof. The terminal 15 also forms a unitary assembly with a superconductor 12a and is fabricated in the following manner. First, the powder of the superconductor 12a is placed on the surface of the terminal 15. Thereafter the powder is compacted, bonded, extruded, electrodeposited or otherwise processed to make a unitary composite.

The ceramic superconductors 11a and 12a are the same as the ceramic superconductor 1a used in the first embodiment with respect to the material of which they are made and to the method of preparing them.

Both the support 11b of the plug 11, which is made of a good electrical conductor such as copper or aluminum in pipe form, and the support 12b of the socket 2, which is also made of a good electrical conductor such as copper or aluminum in pipe form, are preferably designed to haVe a minimum cross-sectional area in order to facilitate transfer of current from the superconductor 11a to 12a.

The supports 11b and 12b are formed of a high conductivity conducting metal. However, current is not to be passed through the metal, unlike the case of the prior art products, and these supports will function as a stabilizer and support for the superconductors 11a and 12a. Therefore, the cross-sectional area of each support need not be made as large as in the prior art versions in order to ensure the necessary current-carrying capability of the lead. As a result, the possible heat conduction to liquid helium or other cryogens can be significantly reduced.

The socket and plug in the conventional detachable current carrying lead are made of copper conductors or brass (in the case of the socket) which are good electrical conductors and good heat conductors as well. Accordingly, a Joule loss will occur as a result of a voltage drop that takes place in the material itself when current is applied and which also takes place due to the contact resistance between the socket and plug. The heat generated by this Joule loss is transmitted into liquid helium, liquid nitrogen or other cryogens in which a superconducting magnet is submerqed, and the heated cryogen will evaporate. By contrast, the current-carrying lead according to the second embodiment of the present invention is in the form of a composite consisting of a ceramic superconductor and a support made of a good electrical conductor. This second embodiment structure is substantially free from the Joule loss that might occur as a result of voltage drop due to contact resistance between the socket and plug.

As described previously, the current-carrying lead of the present invention is formed of a composite consisting of a ceramic superconductor and a support made of an insulator, a nonmagnetic metal or a good electrical conductor. If current is supplied to a superconducting magnet or devices through this lead when the lead is maintained at a temperature below the critical temperature for the superconductor, the occurrence of the Joule loss is reduced to a very low level. The support, which is made of a nonmagnetic metal or good electrical conductor, functions merely as a support or stabilizer for the superconductor and is not required to have a current-carrying capability necessary for enabling it to work as a current-carrying member. Therefore, the cross-sectional area of the support can be sufficiently reduced to realize a significant decrease in the conduction of heat from the hot area to liquid helium and other cryogens. Since the evaporation of cryogens can be held to a minimum level, the cryogen tank does not need to be constructed in a large enough size to allow for the anticipated evaporation of cryogens during current application and the current-carrying lead of the present invention can be used with a compact cryogen tank.

The current-carrying lead of the present invention is particularly effective when it is used for a superconductive coil or similar device which is cooled by liquid helium and is also effective where cooling by liquid nitrogen is involved.

While the present invention has been described with respect to preferred embodiments, alternative embodiments consistent with the teachings herein would be known and understood by one of ordinary skill in the art and are intended to be encompassed by the present invention.

What is claimed is:

1. A current-carrying lead for connection between a source of current supply and a superconducting device, comprising at least two parallel ceramic superconductors,
   a longitudinal support for each superconductor, and
   a spacer that is disposed between said supports in their longitudinal direction and a plurality of retains that are provided around the circumference of said ceramic superconductors, said retainers being spaced along the longitudinal dimension of said supports to retain said spacer, supports and superconductors in position.

2. A current-carrying lead according to claim 1 wherein each support is an insulator.

3. A current-carrying lead according to claim 2 wherein each said insulator is formed of a material taken from the group consisting of glass fiber reinforced plastics, poly-tetrafluoro-ethylene resin and carbon-fiber reinforced plastics.

4. A current-carrying lead according to claim 1 wherein each support is made of an electrically conductive material.

5. A current-carrying lead according to claim 4 wherein said electrically conductive material is a nonmagnetic metal.

6. A current-carrying lead according to claim 5 wherein said nonmagnetic metal is taken from the group consisting of copper, aluminum and stainless steel.

7. A current-carrying lead according to claim 4 wherein each support is structured to have a cross-sectional area that is the minimum required in order to provide stabilization and support but without consideration for its ability to carry current.

8. A current-carrying lead according to claim 1 wherein each ceramic superconductor comprises a material taken from (i) the group Ib elements, (ii) a material taken from the Group IIa elements, the Group IIIb elements and lanthanides and a (iii) a material taken from among oxygen and flourine.

9. A current-carrying lead according to claim 8 wherein said Group Ib elements comprise Cu and Ag.

10. A current-carrying lead according to claim 1 wherein at least one of said supports is an insulator.

11. A current-carrying lead according to claim 1 wherein at least one of said supports is a metal, said spacer is an insulator, and each of said retainers is a disk insulator.

12. A current-carrying lead according to claim 1 wherein at least one of said supports is a metal, said spacer is an insulator, and each of said retainers is insulating tape.

* * * * *